United States Patent [19]

Monahan et al.

[11] 3,793,710

[45] Feb. 26, 1974

[54] METHODS OF BONDING A BEAM-LEAD DEVICE TO A SUBSTRATE

[75] Inventors: Jack J. Monahan, Allentown; Fred J. Schneider, Catasauqua, both of Pa.

[73] Assignee: Western Electric Company, Incorporated, New York, N.Y.

[22] Filed: Oct. 12, 1971

[21] Appl. No.: 188,272

[52] U.S. Cl. ..................... 29/577, 29/471.1, 29/626, 228/6, 317/234 N

[51] Int. Cl. ............................................. B01j 17/00

[58] Field of Search ....... 29/470.1, 471.1, 626, 577, 29/203 B; 228/3, 4, 6, 44; 174/DIG. 3; 317/234 N

[56] References Cited

UNITED STATES PATENTS

| | | | |
|---|---|---|---|
| 3,475,814 | 11/1969 | Santangini | 29/471.1 X |
| 3,559,279 | 2/1971 | Miklaszewski | 29/577 X |
| 3,627,190 | 12/1971 | Ramsey | 228/4 |
| 3,698,621 | 10/1972 | Burke et al. | 29/626 X |

*Primary Examiner*—J. Spencer Overholser
*Assistant Examiner*—Robert J. Craig
*Attorney, Agent, or Firm*—W. O. Schellin; P. J. Tribulski, Jr.

[57] ABSTRACT

A beam-lead bonder incorporates an automatically indexable feeder slide for feeding a selected integrated circuit device to a bonding station, and a shuttle table for positioning a particular bond site on a substrate in alignment with the selected device. The alignment can be checked by optical instrumentation and refined by a micromanipulator. Before bonding, the device is transferred to the bonding tip of the bonder, and the substrate is transferred to a bonding support. The feeder slide and the shuttle table retract, permitting the table to be loaded with a substrate for a subsequent bonding operation while bonding of the previously aligned device and substrate is taking place. The bonded substrate disengages from the bonding support after bonding and slides into a receiving tray.

7 Claims, 10 Drawing Figures

INVENTORS
J.J. MONAHAN
F.J. SCHNEIDER
BY W. O. Schellin
ATTORNEY

METHODS OF BONDING A BEAM-LEAD DEVICE TO A SUBSTRATE

BACKGROUND OF THE INVENTION

1. Field of the Invention

The invention relates to methods of bonding a device to a predetermined area of a substrate, and, more particularly, to methods of successively bonding beam-lead integrated circuit devices to predetermined areas on substrates.

2. Description of the Prior Art

In accordance with prior art techniques, devices known as beam-lead integrated circuits have bonded to substrates having thin film circuit patterns thereon. The minute size of beam-lead devices has led to the development of costly, high-precision apparatus for performing the bonding operations. To make integrated circuit bonding more economical by reducing the per unit production cost of the bonded product, it is desirable to keep the initial cost of the bonding apparatus at a minimum, and, more importantly, to increase the hourly production rate of the bonding apparatus.

According to commonly known practices in the art, the device and the substrate are visually aligned in the bonding apparatus by observing the particular workpieces through a microscope and then centering them with respect to the indications of a reticle contained in the optics of the microscope. A tray supporting a number of the devices is moved into the field of view of the microscope and is then further manipulated to align one of the devices with the reticle. Manipulation on a large scale to bring a particular device into the field of view of the microscope followed by further manipulation to align the device for bonding is cumbersome and significantly decreases the output rate of a particular bonding apparatus.

Most integrated circuit bonding applications require the bonding of only a single integrated circuit device to a particular substrate. A known apparatus for that type of bonding operation uses a magazine type substrate feed. Substrates to be bonded are serially arranged in a magazine. The magazine holding the substrate is indexed between successive bonding operations to successively bring the bond site of the next substrate into the field of view of the microscope for alignment with respect to the device.

In this apparatus, the alignment of the integrated circuit devices still require gross manipulation to advance the device toward its intended position, and furthermore, it requires precise manipulation to align it with respect to the bonding tip. Loading the substrates into magazines also requires additional operator time or the use of another costly machine to automate the loading operation.

Furthermore, using such a magazine feed for substrates is not feasible when more than one integrated circuit device is to be bonded to a particular substrate. A magazine feed only advances successive substrates to move the center of the substrates into gross alignment with the bonding station. Where substrates have multiple bond sites, an operator would still have to select a particular bond site for bonding and manipulate the selected bond site by gross adjustment into alignment with the bonding tip.

Therefore, presently known bonding techniques are still cumbersome and time consuming. The average production cost of bonded devices is consequently high.

SUMMARY OF THE INVENTION

It is, therefore, an object of the present invention to provide new and improved methods of handling of integrated circuit devices and substrates for bonding purposes.

It is another object of the invention to reduce manual manipulation of integrated circuit devices and of substrates.

A further object of the invention is to reduce the cycle time of successive bonding operations, and, consequently, to increase the hourly production rate of a bonding process.

With these and other objects in mind, the present invention contemplates new and improved methods of bonding an integrated circuit device to a preselected area of a substrate.

A particular method includes feeding a device and a bond site of a substrate into alignment with each other at a bonding station, bonding the device to the bond site in alignment therewith, and preloading another substrate while the step of bonding is taking place.

A suitable apparatus includes a feeding mechanism for feeding a selected device and the bond site of a selected substrate into alignment with each other. A bonding mechanism bonds the aligned device to the bond site of the substrate. While the bonding mechanism is joining the device and the substrate, a mechanism is positioned for receiving a further selected substrate in preparation for a subsequent bonding operation.

In another aspect of the invention, the bonded assembly of the device and the substrate is disengaged from the bonding mechanism and deposited in a tray for convenient removal.

BRIEF DESCRIPTION OF THE DRAWINGS

Other objects and advantages of the present invention will become apparent from the detailed description when considered in conjunction with the accompanying drawings, wherein.

DETAILED DESCRIPTION

The Product and the Bonding Operation in General

Figure 1:
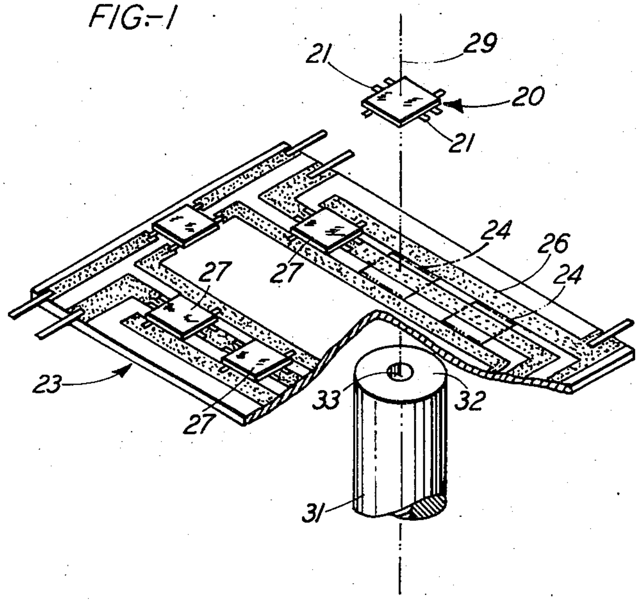
FIG. 1 is a perspective view of a substrate having a plurality of bond sites and of an integrated circuit device in alignment with one of the bond sites along the bonding axis.

Referring to FIG. 1, there is shown in perspective a semiconductor device, such as an integrated circuit device, designated generally by the numeral 20, having beam-like leads 21 thereon. Because of the nature of the beam-like leads 21 extending from its periphery the device 20 is also referred to as beam-lead device. It is desired to attach the devices 20 to a substrate, designated generally by the numeral 23, in precise alignment with bond sites 24, shown as dotted outlines of the devices 20. This alignment locates the beam-leads 21 in superposition with a conductive pattern 26 on the substrate 23. A bonding process establishes electrical connection between the leads 21 and the conductive pattern 26. The substrate 23 is shown with a number of other devices 27 already bonded into place.

Each bonding operation is performed in axial alignment with a bonding axis 29. A bonding support 31 is concentrically located along the bonding axis 29 to support the substrate 23 on the bonding axis. A face 32 of the support 31 contacts the underside of the substrate 23 and a partial vacuum generated between the support 31 and the substrate 23 via an aperture 33 in the face 32 holds the substrate 23 firmly in place during bonding.

Figure 2:
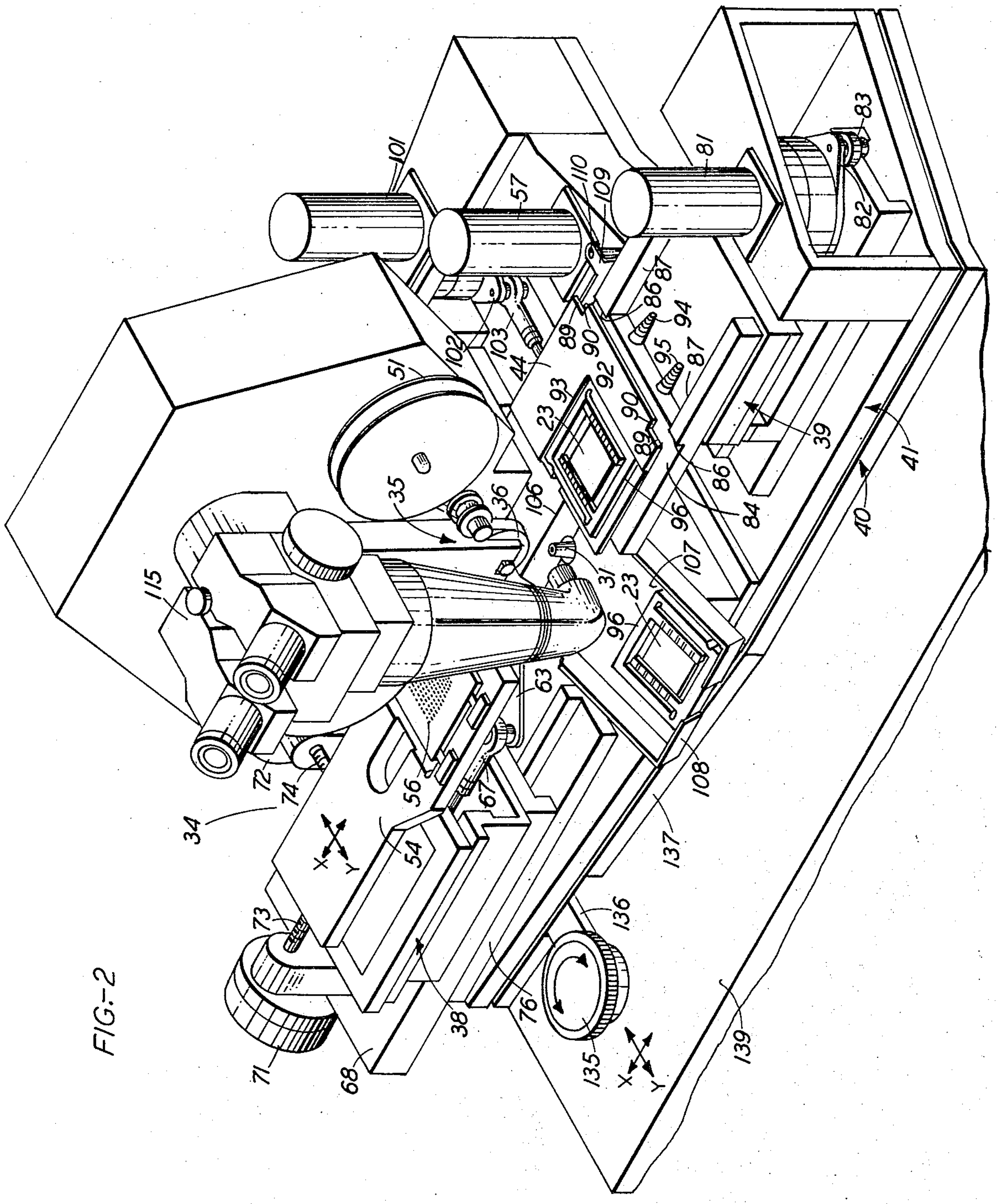
FIG. 2 is a perspective view showing a bonding apparatus portraying a particular embodiment of the subject matter of this invention.

FIG. 2 shows a beam-lead compliant bonding apparatus, designated generally by numeral 34, as a exemplary embodiment of the invention. The compliant bonding apparatus 34 comprises a bonding station, designated generally by the numeral 35, which includes the bonding support 31 in concentric relation to the bonding axis 29, and a bonding head 36 facing the bonding support 31. The bonding head 36 comprises at least one bonding tip 37 (see FIGS. 3–6) which is in alignment with the bonding axis 29 and movable toward the bonding support 31.

A feeder slide, designated generally by the numeral 38, and a shuttle table, designated generally by the numeral 39, are mounted to a base 40 which, in turn, is supported by a micromanipulator, designated generally by the numeral 41. The shuttle table 39 is shown with one of the substrates 23 preloaded for movement toward the bonding station 35.

Figure 3:
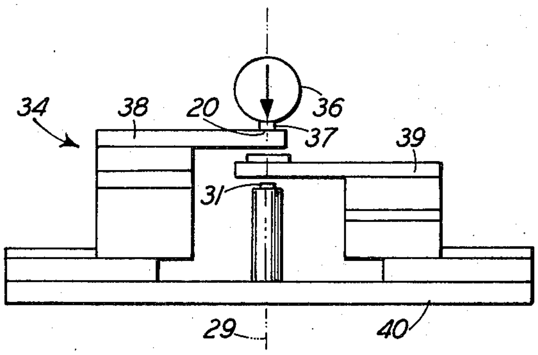
FIG. 3 through FIG. 6 show various components of the bonding apparatus of FIG. 2 at different stages of the bonding operation.

FIGS. 3 through 6 outline the bonding of the device 20 to the substrate 23. FIG. 3 shows the start of a bonding operation. The feeder slide 38 followed shortly thereafter by the shuttle table 39 move into intersecting relation with the bonding axis 29 during the initial phase of the bonding cycle. The feeder slide 38 is located adjacent to the bonding tip 37. The distance between the feeder slide 38 over the base 40 is greater than the height of the shuttle table 39. Thus, the shuttle table 39 has moved into intersecting relation with the bonding axis 29 between the feeder slide 38 and the base 40. The movement of the feeder slide 38 toward the bonding axis 29 feeds a semiconductor device 20 into alignment with the bonding tip 37. In this manner of operation, gross alignment of the selected device 20 is repeatedly achieved. Particular fine adjustments in alignment are made, where necessary, by operation of the micromanipulator 41.

After the device 20 is in alignment with the bonding tip 37, the operation continues to the state as shown in FIG. 3. The bonding head 36 moves along the bonding axis 29 toward the feeder slide 38 to bring the bonding tip 37 into contact with the semiconductor device 20. A vacuum provision similar to that described with respect to bonding support 31 permits the bonding tip 37 to firmly hold the device 20, Thus, when the bonding head 36 moves upward again, as shown in FIG. 4, the semiconductor device 20 is transferred from the feeder slide 38 to the bonding tip 37.

Figure 4:
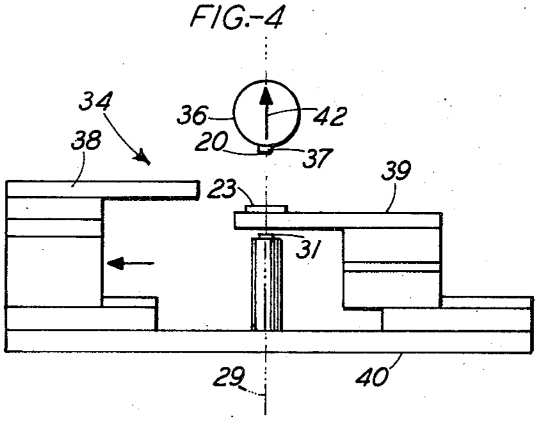

FIG. 4 further shows the feeder slide 38 in a retracted position away from the bonding axis 29. The movement of the feeder slide 38 out of intersecting relation with the bonding axis 29 occurs after the bonding head 36 has moved in the direction indicated by arrow 42 into an up position. With the feeder slide retracted, the loaded shuttle table 39 is located adjacent to the bonding head 36 and the transferred device 20.

Figures 7, 8:
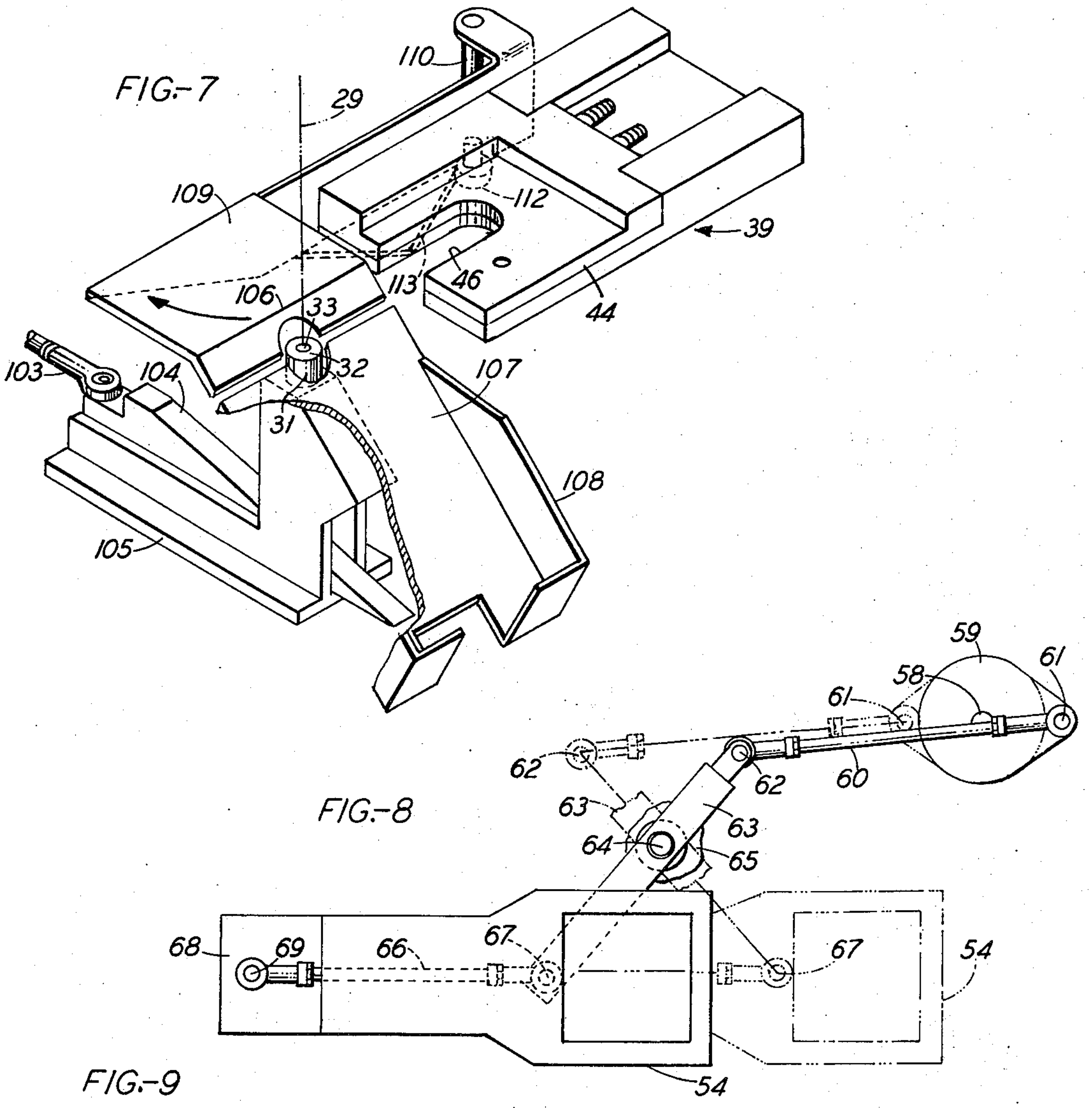
FIG. 7 is a perspective view showing a portion of a shuttle table particularizing a certain feature included in the invention.
FIG. 8 is a partial view of the bonding apparatus highlighting a mechanism for moving devices to a bonding station.

The movement of the shuttle table 39 toward the bonding axis 29 brings one of the substrates 23 into a position with respect to bonding axis 29 to align a predetermined one of the bond sites 24 (as shown in FIG. 1) on the surface of the substrate 23 with the bonding axis 29. The bonding support 31 is consequently directly below the aligned bond site 24. Referring briefly to FIG. 7, the shuttle table 39 shows a support plate 44 for maintaining the substrates 23 (not shown in FIG. 7) in a predetermined position while table 39 moves into alignment with the bonding axis 29. An elongated cutout 46 in the table 39 and particularly in the support plate 44 is in intersecting relation with an axial extension of the bonding support 31, such that no portion of the table 39 or the support plate 44 will interfere with any portion of an axial extension of the bonding support 31 when the table moves toward the bonding axis 29.

Figure 5:
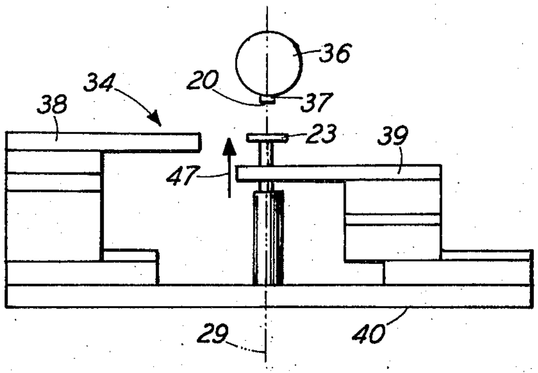

FIG. 5 shows ths shuttle table 39 in position over the bonding support 31. The bonding support 31 is raised through the cutout 46 in the table 39 to move into contact with the substrate 23. The vacuum action through aperture 33 in the bonding support 31 draws the substrate 23 firmly against the face 32 of the support 31. The bond site 24 is at this time centered with respect to the bonding support 31 and the vacuum action prevents any shifting of the substrate 23.

The movement of bonding support 31 continues upward in the direction of arrow 47 to lift the substrate from its position on the support plate 44 and to raise it to the focal plane in which bonding takes place. Upon transfer of the substrate 23 from the support plate 44 of the shuttle table 39 to the bonding support 31 the shuttle table 39 moves away from the bonding axis 29 and retracts into a preload position.

The movement of the shuttle table 39 toward the bonding axis 29 feeds a substrate 23 into alignment with the bonding tip 37. In this manner of operation, gross alignment of the substrate 23 is repeatedly achieved. Particular fine adjustments in alignment are made, again where necessary, by operation of the micromanipulator 41.

Figure 6:
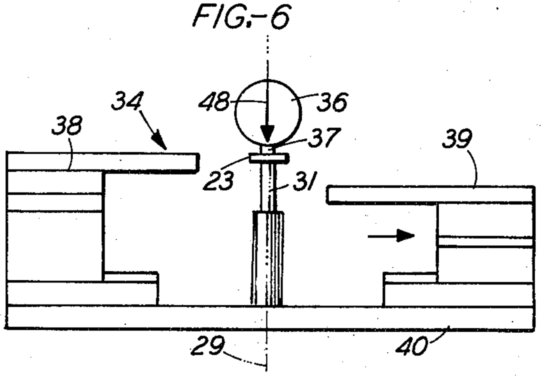

FIG. 6 shows the shuttle table 39 in its retracted or preload position. In this position the support 44 of the table 39 is accessible to permit loading one of the substrates 23. After movement of the bonding support 31 to the bonding level and after movement of the shuttle table 39 to the preload position, the bonding head 36 moves downward in the direction of arrow 48 to effect the bonding of device 20 to the bond site 24 on substrate 23. Thus, it becomes possible to preload one of the substrates 23, which means to load one of the substrates 23 selected for bonding in the next following bonding operation onto the shuttle table 39 while bonding of the previously positioned device 20 and substrate is taking place.

The Bonding Station

In the particular embodiment shown in FIG. 2, the bonding tip 37 is one of a plurality of bonding tips 37 located circumferentially around a cylindrical bonding head 36. The bonding head 36 is axially movable along the bonding axis 29 and is also mounted to rotate about its own axis. A supply reel 51 distributes a strip of compliant-bonding material crcumferentially over the side of bonding head 36 which faces the bonding support 31. The compliant-bonding material is thus interposed between the bonding tip 37 and the device 20 for engaging the beam leads of the device 20 during bonding. A complete description of the operation of the compliant bonding apparatus can be found in application Ser. No. 863,259 filed on Oct. 2, 1969 in the name of D. P. Ludwig and assigned to the assignee of this application.

The Feeder Slide

The feeder slide 38 shown in the particular embodiment in FIG. 2 has a top plate 54 to hold a supply array 56 of semiconductor devices 20 for successive bonding operations. The movement of the feeder slide 38 is accomplished by a gear motor 57 and corresponding drive linkages further illustrated in FIG. 8. Upon each actuation, the output shaft 58 of the gear motor 57 turns through 180° and then stops. A crank 59 is rigidly attached to the output shaft 58. A link 60 has two pivot joints 61 and 62, pivot joint 61 being movably connected to the crank 59. The pivot joint 62 is connected to one end of a bell crank 63 which rotates about a bearing shaft 64 mounted to a slide base 65. The other end of the bell crank 63 is pivotally joined to a slide link 66 at a pivot 67. The slide link 66 connects to a movable base 68 of the feeder slide 38 at a pivot bearing 69. Thus, when a particular actuation of gear motor 57 moves the feeder slide 38 from its retracted position, the next following actuation of motor 57 returns the slide 38 to its retracted position.

The alignment of the particular one of the devices 20 to be selected from the array 56 is accomplished by two stepping motors 71 and 72 and their respective lead screws 73 and 74. The top plate 54 is mounted to a feeder-slide base 76 for movement in an X-Y plane. After the desired device 20 has been transferred to the bonding tip 37, the feeder slide 38 retracts. Between the retraction and the next bonding cycle when feeder slide 38 again moves toward the bonding axis 29, the top plate 54 is indexed according to the spacing of the devices 20 on the array 56.

Preferably, the devices 20 are arranged in an orthogonal pattern in rows and columns which are aligned with the X-Y pattern to facilitate indexing. Each time after a transfer of one of the devices 20 to the tip 37 has taken place one of the motors 71 or 72 steps through a predetermined number of steps. The motion of the motor 71 is transmitted to the leadscrew 73. Should motor 72 be stepping, then its movement is transmitted to leadscrew 74. Leadscrew 73 is connected to drive the top plate 54 in the X-direction and rotation of leadscrew 74 moves the top plate 54 in the Y-direction. The pitch of the leadscrews 73 and 74 is chosen to produce a desired amount of displacement of the top plate 54 for a predetermined number of steps of the stepping motors 71 and 72.

The devices 20 are arranged on the supply array 56 in spaced increments identical to the incremental movement of the top plate 54. Thus, after one of the devices 20 coincides with the bonding axis 29, other devices 20 are successively stepped into alignment with the bonding axis 29 as the top plate 54 is indexed from position to position according to the predetermined steps.

The Shuttle Table

FIG. 2 shows a gear motor 81 which moves the shuttle table 39 between its retracted position away from the bonding axis 29, and its forward position toward the bonding axis 29. Each time motor 81 is actuated, its output shaft (not shown) rotates one half turn. This motion is transmitted by a crank 82, similar to the crank 59 of the feeder slide drive. A connecting link 83, similar to the link 66 of the feeder slide, drives a slidable top portion 84 of the shuttle table 39 between its retracted and its forward position.

The top portion 84 is equipped with two pairs of precision-milled reference edges 86 and 87. A support plate 44 has reference edges 89 and 90 which are complementary to the geometry of the reference edges 86 and 87 to permit locating the support plate 44 in precise position on the slidable top portion 84 of the shuttle table 39.

The support plate 44 has two locator edges 92 and 93 which are orthogonal to each other. These locator edges 92 and 93 are formed on the support plate 44 in predetermined location with respect to the reference edges 89 and 90 to place the locator edges 92 and 93 ultimately into a predetermined position with respect to the shuttle table 39. Since the shuttle table 39 maintains a nominally fixed relation to the bonding axis 29, the locator edges 92 and 93 respond to a movement of the shuttle table 39 toward the bonding axis 29 to assume a predetermined positional relation to the bonding axis 29 when the shuttle table 39 is in its forward position.

To prevent any shift in position of the support plate 44 with respect to the slidable top portion 84, a vacuum port 94 permits application of a vacuum to lock the support plate 44 in place. Means other than a vacuum as, for instance, a commonly known magnetic chuck may be used for locking the support plate 44 in position with respect to the slidable top portion without departing from the scope of this invention.

Locator edges 92 and 93 reference the substrate 23 with respect to the bonding axis 29, such that when two mutually perpendicular edges of the substrate are placed against the corresponding locator edges 92 and 93, a particular area of the substrate, such as the bond site 24, will be axially aligned with the bonding axis 29 when the shuttle table 39 is in its forward position.

To align a different bond site 24 with the bonding axis 29 in subsequent operations, a modified version of the support plate 44 is required. The modified support plate 44 is similar to the original support plate except for shifting of the locator edges 92 and 93 to a different position with respect to the reference edges 89 and 90 by a predetermined distance. When this distance is equal to the distance between, for example, two adjacent bond sites 24 on the substrate 23 the shifted locator edges 92 and 93 also change the position of one of the located substrates. This shifting in position brings the new bond site 24 into alignment with the bonding axis 29 when the shuttle table 39 is in its forward position. A plurality of the support plates 44, each having locator edges 92 and 93 shifted with respect to the other plates to align a particular area of one of the substrates 23 with respect to the bonding axis 29, is provided for substrates requiring bonding at multiple bond sites.

FIG. 2 shows one of the substrates 23 in position on the support plate 44, the substrate being contained in a shipping frame 96. The handling of substrates 23 in shipping frames 96 is done for protection of the substrates 23 and for convenience. When it is contemplated to use substrates 23 in shipping frames 96, the support plates 44 for locating predetermined bond sites, such as bond site 24, must make allowance for the size of the shipping frame 96, and the locator edges 92 and 93 must be appropriately positioned. The use of a shipping frame 96 in conjunction with a substrate 23 is embraced by the scope of the claimed invention. Thus, when the term "substrate" is used with respect to the claimed invention, it equally applies to a substrate 23 with and without the described shipping frame 96.

Substrate Removal and Bonding Support

The bonding support 31 executes a reciprocating movement. It moves upward in the direction of the bonding head 36 to lift the substrate 23 from the support plate 44 and to raise the substrate to the focal plane in which bonding takes place. After bonding has been completed, the support 31 returns to a retracted position below the top level of the support plate 44.

This motion is accomplished by a gear motor 101 which actuates an output crank 102 in one-half revolutional increments. Crank 102 drives a connecting link 103 which, in turn, actuates a wedge-shaped cam 104 to drive the bonding support 31 upward. The cam 104 as guided by the frame 105 slides out from under the downwardly spring-biased bonding support 31 and allows the bonding support to retract.

As the bonding support 31 retracts after bonding, the substrate 23 is still engaged to the face 32 because of the action of the vacuum holding substrate 23 in position. The substrate 23 being lowered by support 31 comes into contact with a projecting ledge 106. Thus, the substrate 23 is lifted from face 32 of the retracting support 31 by the ledge 106. Lifting the substrate 23 from the face 32 permits air to enter between the substrate and the face, whereby the vacuum is rendered ineffective and substrate 23 is disengaged from the bonding support 31 while the vacuum stays on.

Following its disengagement from the bonding support 31 substrate 23 slides down an incline 107 into a receiving tray 108 from which the substrates 23 may be removed at any convenient time, as for instance during the time that a semiconductor device 20 is picked up by bonding tip 37.

The projecting ledge 106 is part of a bracket 109. The bracket 109, positioned as shown to permit the stripping of the substrate 23 from the bonding support 31, interferes with the movement of the shuttle table 39 toward the bonding axis 29. Therefore, the bracket 109 is pivotally mounted to swing out of the way of the shuttle table 39 when the shuttle table moves forward. The bracket 109 pivots about shaft 110. This pivotal movement is initiated by the shuttle table 39 moving toward the the bonding axis 29. A roller 112 mounted to the underside of the shuttle table 39 bears against a cam surface 113 on the bracket 109. As the shuttle table 39 moves into the forward position toward the bonding axis 29 it drives the bracket 109 in the direction indicated by the arrow and swings it clear of the forward movement of the shuttle table 39.

Optical System and Micromanipulator

The apparatus so far described is capable of, at least, automatic gross alignment of a device 20 and of a predetermined bond site 24 on a substrate 23 with respect to the bonding axis 29. The exact alignment depends, of course, upon the accuracy with which the devices 20 are located on the array 56, and generally upon the tolerances of all dimensions involved. While it is theoretically possible to align devices 20 with respect to a predetermined area on substrates 23 consistently in a series of successive operations, it is more practical to ensure precise alignment between the device 20 and the substrate 23 by requiring an operator of the bonding apparatus to visually check the alignment of the device 20 and substrate 23 with respect to the bonding axis 29 and to make continual appropriate adjustments by operating the micromanipulator 41.

Figure 9:
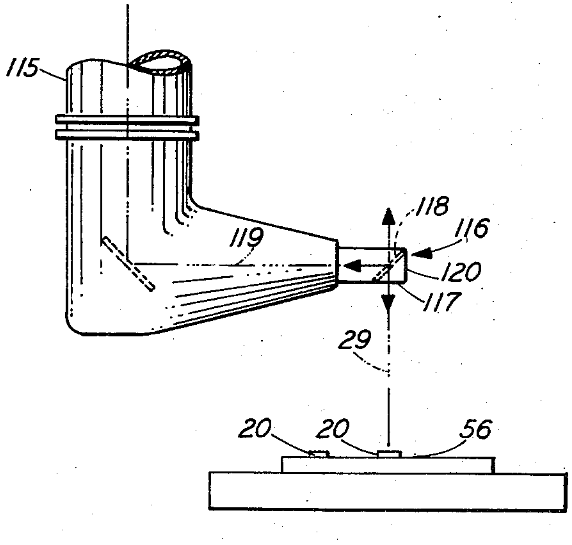
FIG. 9 is a schematic representation of a portion of the optical inspection apparatus of FIG. 2.

Referring to FIG. 2 and FIG. 9, a microscope 115 includes a split optics objective, designated generally by the numeral 116, which is pivotally mounted to enable it to swing into and out of alignment with the bonding axis 29. When the bonding tip 37 is in its normal up-position, the objective 116 is in precise alignment with the bonding axis 29. The position of the objective 116 is approximately midway between the end of the bonding tip 37 facing the objective and the array 56 when the array is in intersecting relation with the bonding axis 29.

The split optics objective 116 uses a prism 117 having a semi-reflective prismatic surface 118 located on the optical axis 119 which is intersecting the bonding axis 29 at a right angle. The prismatic surface 118 is inclined at an angle of 45 degrees with respect to both the viewing axis 119 and the bonding axis 29. In operation, light from the bonding tip 37 entering the objective 116 is reflected along the viewing axis 119. Light originating at the array 56 and entering the objective 116 is reflected at the prismatic surface 118 along the extension of the viewing axis 119 toward surface 120. Surface 120 is fully reflective and is disposed perpendicular to the viewing axis 119. The light originating from the direction of array 56 is therefore reflected from surface 120 and, because of the semi-reflective characteristics of the prismatic surface 118, a discernible portion of the light is transmitted straight through prismatic surface 118 along the viewing axis. Consequently, an operator monitoring the alignment of the bonding tip 37 with respect to a selected device 20 on the array 56 will simultaneously observe the image of the face of bonding tip 37 superimposed upon the image of the selected device 20. Any misalignment can thus easily be detected.

As previously described, bonding tip 37 moves from its normal up-position along bonding axis 29 toward array 56 to effect transfer of the device 20 from the array 56 to the the bonding tip 37. To permit the bonding tip 37 to execute this movement, the objective 116 has to swing out of the path of the tip. As shown in FIG.

2, the microscope 115 is rigidly mounted to the bonding apparatus 34. The prismatic objective 116, however, is pivotally mounted to swing out of the way of the bonding tip 37 any time the tip starts to move from tis up-position. The pivotal movement of the objective prism 116 to swing out of the path of the tip 37 is generated by conventional cam means (not shown). With the objective 116 removed from its path, bonding tip 37 can move to the level of the device 20 on the array 56.

FIG. 9 shows array 56 in position under the objective 116. Referring briefly to FIG. 5, showing the feeder slide 38 in the retracted position, the bonding support 31 has raised the substrate 23 to the bonding (focal plane) level. The bonding level is at substantially the same level as the level of the supply array 56. Therefore, the substantially identical motion by the bonding tip. 37 required for transferring a device 20 to the tip 37 is also required to effect bonding.

Thus, when the bonding tip 37 returns to its up-position together with the transferred device 20, the objective 116 swings again into line with the bonding axis 29. After transfer of the semiconductor device 20 to the bonding tip 37 and after the bonding tip 37 has raised the substrate 23 to the focal plane at which bonding takes place, the operator can observe the accuracy of the alignment between the device 20 on bonding tip 37 and the predetermined bond site 24 of substrate 23 which is now supported by the bonding support 31.

To permit fine adjustment of any deviation of a device 20 or of the bond site 24 from their ideal position centered with respect to bonding axis 29, the conventional micromanipulator 41 is incorporated into the bonding apparatus. The micromanipulator 41 comprises a conventional leverage mechanism (not shown) to transmit motion from a knob 135 mounted in combination with a lever 136 to the base 40 to which the feeder slide 38 and shuttle table 39 are mounted. The bonding station 35 is stationary with respect to the motion of the base 40. Sliding the lever 136 in the X or Y direction produces a proportionately smaller translational movement at the base 40. A rotary movement of knob 135 produces a small angular change in the position of the base 40. Thus, minute adjustments may be made by the operator to first align a selected device 20 with respect to the bonding axis 29 and then to align the predetermined bond site 24 with respect to device 20 held by the bonding tip 37.

Control Sequence

Sequentially starting and stopping the operation of each of the components of the bonding apparatus 34 in the described manner is accomplished by means commonly known and used in the art, such as for instance, conventional solid state electronic switching circuits (not shown).

Figure 10:
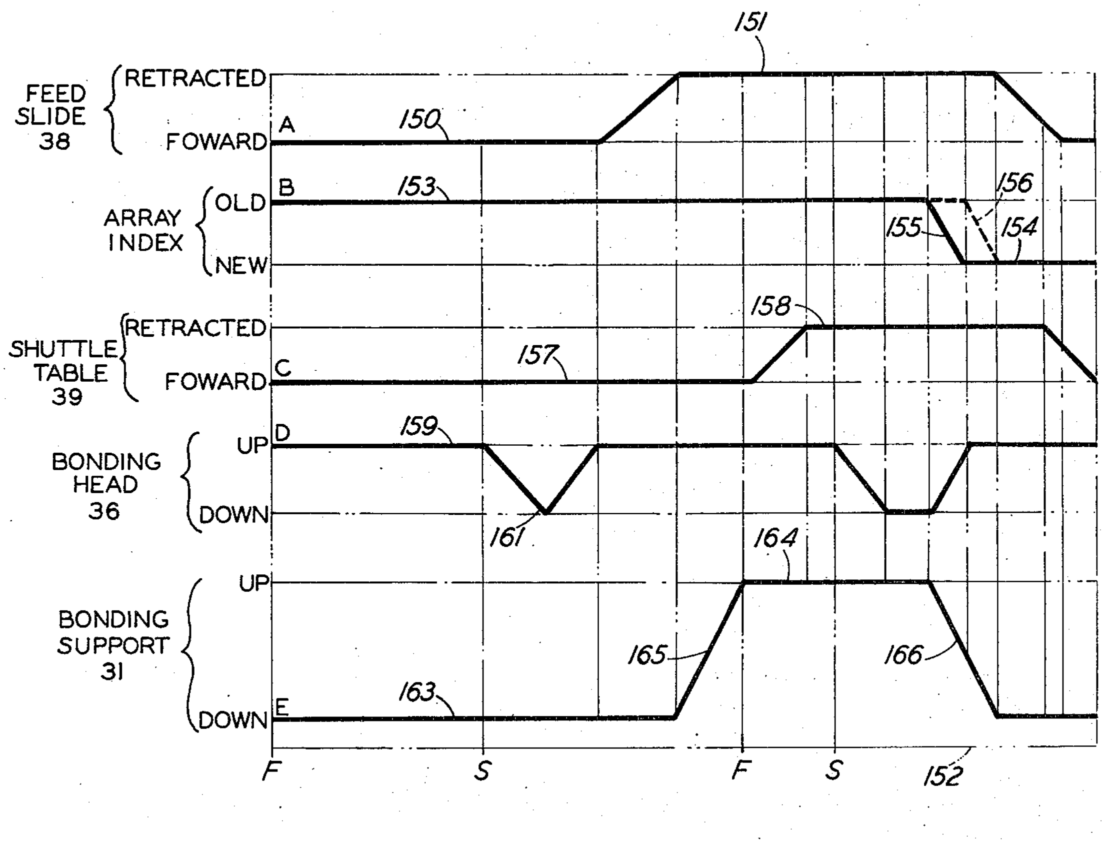
FIG. 10 is a timing diagram showing the timed relation of the movements of various components of the bonded apparatus of FIG. 2.

FIG. 10 illustrates the preferred sequence of operation of the various components of the apparatus 34 in relation to each other. Progress in time is indicated by horizontal displacement along the abscissa of the timing chart in FIG. 10. The ordinate indicates position of the various components of the apparatus 34, such that a horizontal line of a particular graph in the chart indicates a non-changing position of the component represented by the graph, while a sloped line indicates movement of the component from one position to another. There is no time scale or position scale to the chart; therefore, only a relative timing comparison between any of the various components is meaningful.

Graph A represents the feeder slide 38, which moves from a forward position 150 at the beginning of the bonding cycle to a retracted position 151 after one of the devices 20 has been transferred to the bonding tip 37. The time positions marked by the letter S along the time axis 152 indicate instances at which the operator has to start or re-start the apparatus 34 if the bonding cycle is to proceed. The first S position represents the re-start for automatic device pickup after the operator has aligned a device 20 with the bonding axis 29. The second S position indicates the initiation of bonding per se after an alignment check of the substrate 23 with the bonding axis 29.

Graph B portrays the index position of the supply array 56 of the semiconductor devices 20. Level 153 portrays the array 56 in indexed position to permit a particular one of the devices 20 of the array to be moved into alignment with the bonding axis 29 upon movement of the feeder slide to position 150. Level 154 indicates a changed position with a subsequent one of the devices 20 of the array 56 in position for alignment with the bonding axis 29. The time difference between the solid sloped line 155 and the broken line 156 indicates a time slot during which the array 56 is preferably indexed to a subsequent position.

Line C shows the movement of the shuttle table 39. The shuttle table 39 is in a forward position 157 at the beginning of the bonding operation and moves to a preload position 158 after the transfer of one of the substrates 23 from the shuttle table 39 to the bonding support 31.

Line D indicates the movement of the bonding head 36 and the bonding tip 37. The head 36 moves, twice during each bonding cycle, from its normal up-position indicated by numeral 159 to its lower position designated by numeral 161. The first movement to the lower position effectuates transfer of the device 20 to the bonding tip 37, and the second movement contacts the device 20 to the substrate 23 for bonding.

Line E portrays the movement of the bonding support 31. A lower level 163 at the beginning of the cycle indicates its retracted position. Position 164 is the bonding level, and at some point along the sloped line 165 the substrate 23 is transferred from the shuttle table 39 to the bonding support 31. Also, at some point along a sloping line 166, representing the movement of bonding support 31 to its retracted position, the bonded substrate 23 will be disengaged from the bonding support 31.

The points labelled by the letter F indicates events during the bonding operation when the automatic motion of the apparatus stops to permit the operator to observe and correct the alignment of the device 20 and of the selected bond site 23 with respect to the bonding axis 29.

Although various specific embodiments of the invention are shown in the drawings and described in the foregoing specification, it will be understood that the invention is not limited to the specific embodiments described, but is capable of modification, rearrangement and substitution of parts and elements without departing from the spirit and scope of the invention.

What is claimed is:

1. A method of bonding a semiconductor device selected from a supply array to a bond site on a selected substrate, comprising:

feeding the selected device toward a bonding axis of a bonding station;

feeding the bond site of the selected substrate toward the bonding axis;

aligning the selected device with the bond site of the selected substrate at the bonding axis;

bonding the device to the bond site of the selected substrate; and loading a further substrate while the step of bonding is taking place in preparation of feeding such further loaded substrate toward the bonding axis prior to aligning the further loaded substrate with another selected device at the bonding axis in a subsequent bonding cycle.

2. A method of bonding sequentially selected semiconductor devices to predetermined areas on substrates successively positioned at a bonding station located on the axial extension of an axially movable bonding tip and between the bonding tip and a bonding support, comprising:

supporting an array of semiconductor devices on a feeder slide;

loading a substrate on a shuttle table in a preloading position;

moving the feeder slide toward the bonding station to position a selected device of the array in axial alignment with and adjacent to the bonding tip;

moving the shuttle table toward the bonding station to locate a predetermined area of the loaded substrate between the selected device and the bonding support;

engaging the bonding tip with the selected device to remove the device from the array;

retracting the feeder slide from the bonding station;

elevating the bonding support toward the substrate to remove the substrate from the shuttle table;

retracting the shuttle table to the preload position;

lowering the bonding tip toward the bonding support to contact the predetermined area of the substrate with the engaged device to bond the device to the substrate; and positioning a substrate for a subsequent bonding operation on the shuttle table while the device is being bonded to the substrate located at the bonding station.

3. A method of bonding according to claim 2 comprising the additional steps of:

raising the bonding tip after the bonding of the device to the substrate to disengage the tip from the device; and disengaging the substrate from the bonding support to prepare the bonding support for a subsequent bonding operation.

4. A method of bonding according to claim 3 wherein the step of disengaging includes lowering the substrate against a fixed stop, the fixed stop acting to dislodge the substrate from the bonding support, and further comprising the step of receiving the dislodged substrate in a tray.

5. A method of bonding a beam-lead device selected from a supply array to a bond site on a selected substrate, comprising:

feeding the device and a predetermined bond site on the substrate into alignment with each other at a bonding station;

bonding the aligned device to the bond site;

selecting another device from the array, to be fed to the bonding station in a subsequent operation;

positioning another substrate on a shuttle table while the step of bonding is taking place in preparation of feeding the other selected device into alignment with a bond site on the positioned substrate in a subsequent operation; and releasing the bonded device and substrate into a tray before starting such subsequent operation.

6. A method of bonding according to claim 5, wherein the step of positioning a substrate comprises locating the substrate against a pair of mutually perpendicular locator edges of a support plate of the shuttle table to place a selected bond site of the substrate in a predetermined position with respect to the bonding station, and wherein the step of feeding comprises (a) moving the shuttle table a precise and predetermined distance toward the bonding station to align the selected bond site of the substrate located on the support plate of the shuttle table with the bonding station; (b) transferring the substrate from the support plate to the bonding station; and (c) retracting the shuttle table the predetermined distance to its earlier position to provide access to the shuttle table for the step of positioning.

7. A method of bonding according to claim 5, wherein a substrate locating support plate is mounted to the shuttle table prior to the step of feeding the device and the predetermined bond site on the substrate into alignment with each other at a bonding station, the method including the additional steps of:

removing the support plate from the shuttle table; and replacing the removed support plate by a second support plate before positioning the substrate on the shuttle table.

* * * * *